(12) United States Patent
Matsukizono

(10) Patent No.: US 10,276,593 B2
(45) Date of Patent: Apr. 30, 2019

(54) ACTIVE MATRIX SUBSTRATE AND METHOD FOR MANUFACTURING SAME, DISPLAY DEVICE USING ACTIVE MATRIX SUBSTRATE

(71) Applicant: Sharp Kabushiki Kaisha, Sakai, Osaka (JP)

(72) Inventor: Hiroshi Matsukizono, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/579,300

(22) PCT Filed: Jun. 2, 2016

(86) PCT No.: PCT/JP2016/066470
§ 371 (c)(1),
(2) Date: Dec. 4, 2017

(87) PCT Pub. No.: WO2016/195039
PCT Pub. Date: Dec. 8, 2016

(65) Prior Publication Data
US 2018/0301472 A1   Oct. 18, 2018

(30) Foreign Application Priority Data

Jun. 5, 2015   (JP) ................. 2015-114701

(51) Int. Cl.
*H01L 27/12*   (2006.01)
*H01L 27/32*   (2006.01)
(Continued)

(52) U.S. Cl.
CPC ........ *H01L 27/1225* (2013.01); *G02F 1/1368* (2013.01); *G09F 9/30* (2013.01);
(Continued)

(58) Field of Classification Search
CPC ............ H01L 29/7869; H01L 27/3241; H01L 27/3244; H01L 27/3246; H01L 27/3248;
(Continued)

(56) References Cited

U.S. PATENT DOCUMENTS 9,412,760 B1 *   8/2016   Bai ..................... H01L 27/124
2003/0047785 A1   3/2003   Kawasaki et al.
(Continued)

FOREIGN PATENT DOCUMENTS

JP   2003-86808 A   3/2003
JP   2010-147458 A   7/2010
(Continued)

*Primary Examiner* — Thanhha S Pham
(74) *Attorney, Agent, or Firm* — Keating & Bennett, LLP

(57) ABSTRACT

An active matrix substrate (1001) includes: a plurality of pixel regions arranged on a substrate (1) in a matrix pattern extending in a first and a second direction; a plurality of gate lines G extending in the first direction; and a plurality of source lines S extending in the second direction, the active matrix substrate having a display area (800) including a plurality of pixel regions and a non-display area (900) located in a periphery of the display area, wherein: the pixel regions each include a thin-film transistor (101) including an oxide semiconductor layer, and a pixel electrode (15) formed integral with a drain electrode (9); gate electrode (3) and the gate lines G are made of a first transparent conductive film; the drain electrode (9) and the pixel electrode (15) are made of a second transparent conductive film and provided in the non-display area (900); and the active matrix substrate further includes a plurality of gate signal lines made of a metal film and a first connecting portion that connects each of the gate lines G to one of the gate signal lines.

14 Claims, 10 Drawing Sheets

(51) Int. Cl.
*H01L 29/786* (2006.01)
*G02F 1/1368* (2006.01)
*G09F 9/30* (2006.01)
*H01L 51/50* (2006.01)
*H01L 29/66* (2006.01)

(52) U.S. Cl.
CPC ........ *H01L 27/124* (2013.01); *H01L 27/1262* (2013.01); *H01L 27/326* (2013.01); *H01L 27/3241* (2013.01); *H01L 27/3262* (2013.01); *H01L 27/3276* (2013.01); *H01L 27/3279* (2013.01); *H01L 27/3297* (2013.01); *H01L 29/66969* (2013.01); *H01L 29/786* (2013.01); *H01L 29/7869* (2013.01); *H01L 51/50* (2013.01)

(58) Field of Classification Search
CPC ............. H01L 27/3276; H01L 27/3279; H01L 27/326; H01L 27/3262; H01L 27/3272; G02F 1/1368; G09F 9/30
See application file for complete search history.

(56) References Cited

U.S. PATENT DOCUMENTS

| 2010/0155792 | A1 | 6/2010 | Ryu et al. |
| 2012/0138922 | A1 | 6/2012 | Yamazaki et al. |
| 2013/0320334 | A1 | 12/2013 | Yamazaki et al. |
| 2014/0286076 | A1 | 9/2014 | Aoki et al. |

FOREIGN PATENT DOCUMENTS

| JP | 2012-134475 A | 7/2012 |
| JP | 2014-7399 A | 1/2014 |
| JP | 2014-209727 A | 11/2014 |

* cited by examiner

FIG.1
(a)
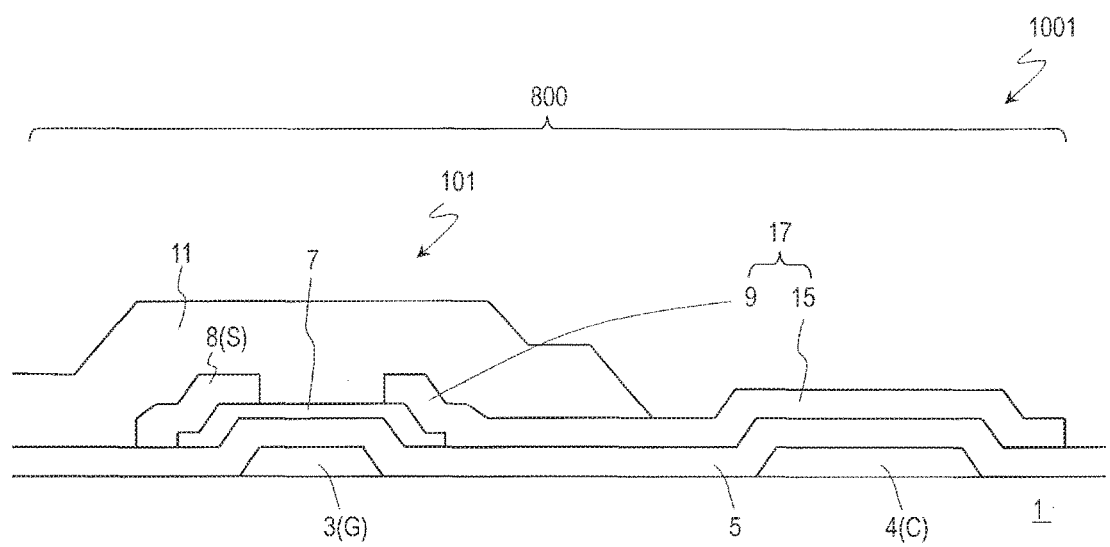
(b)
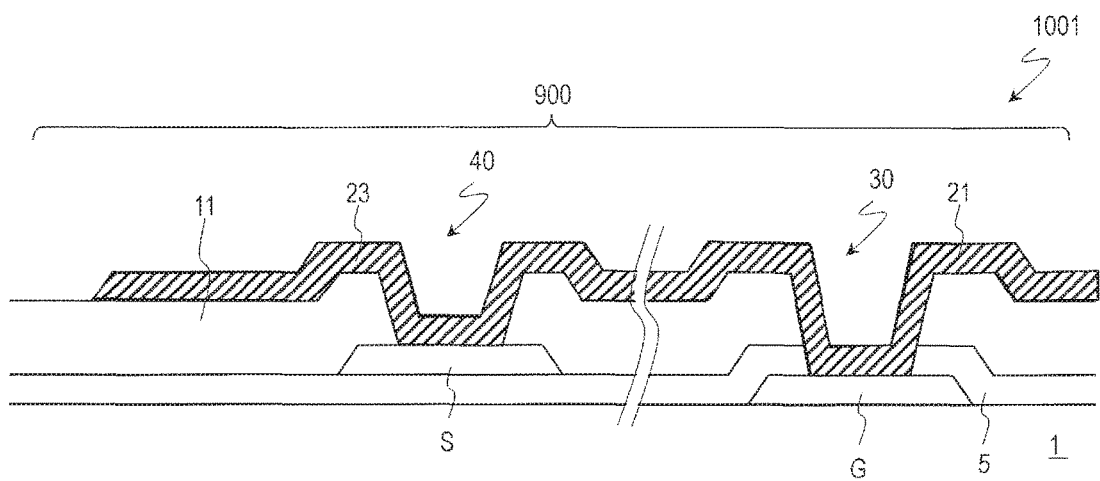

FIG.4
(a)
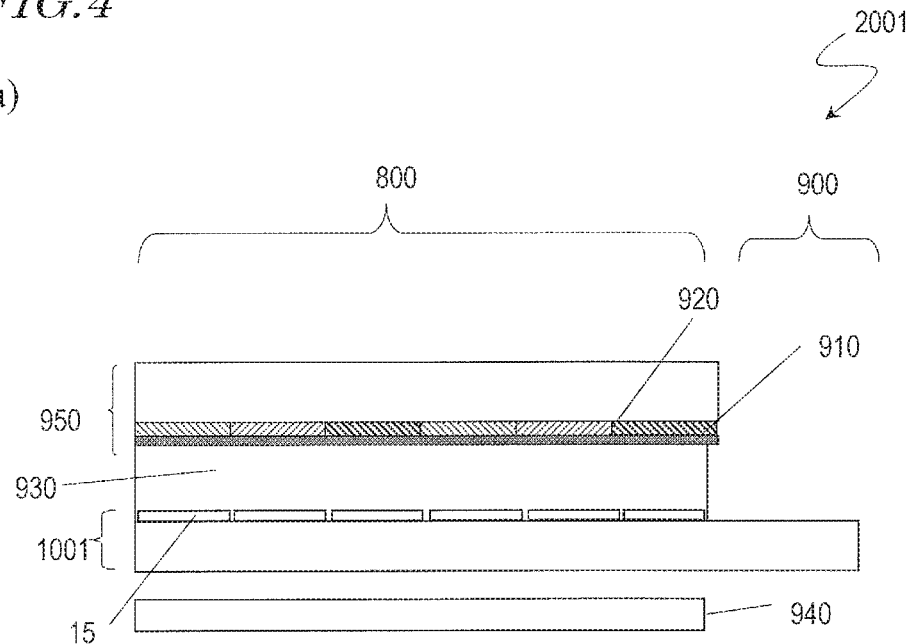
(b)
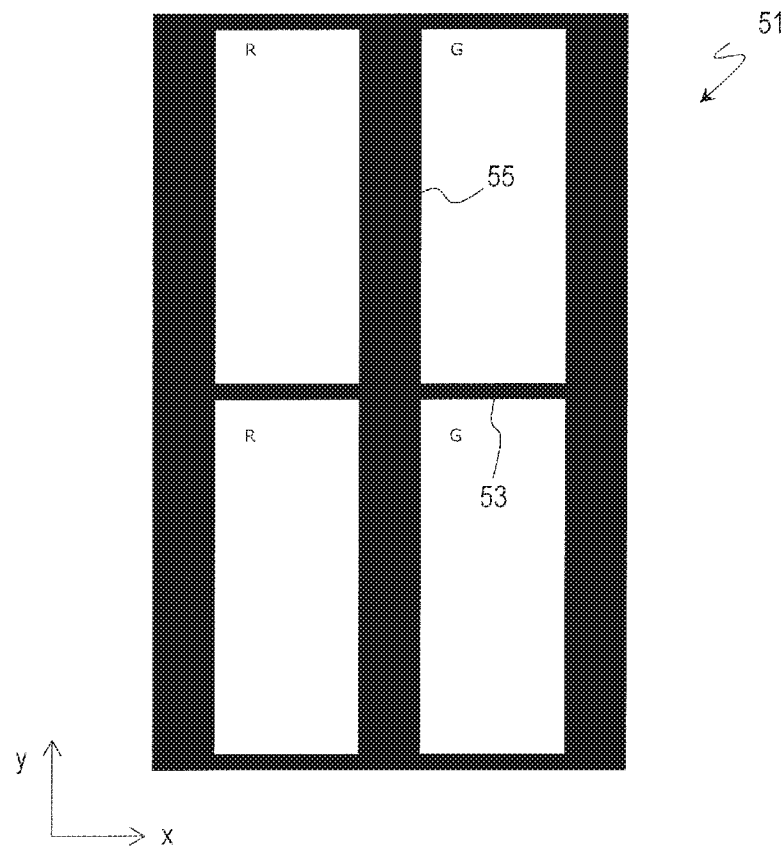

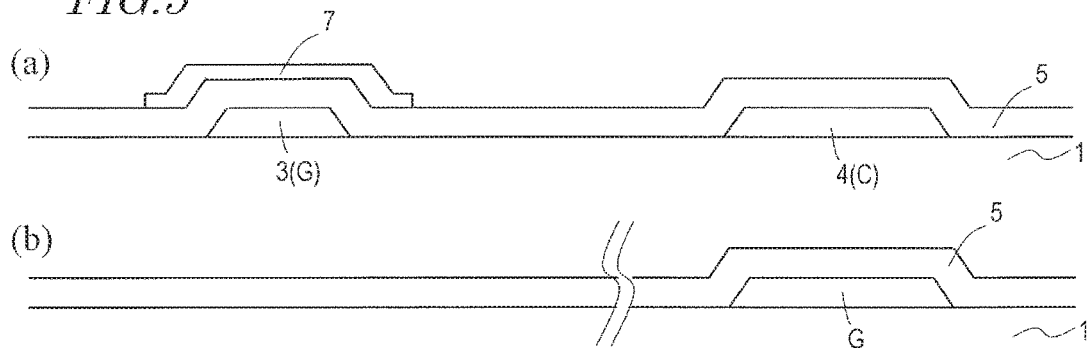
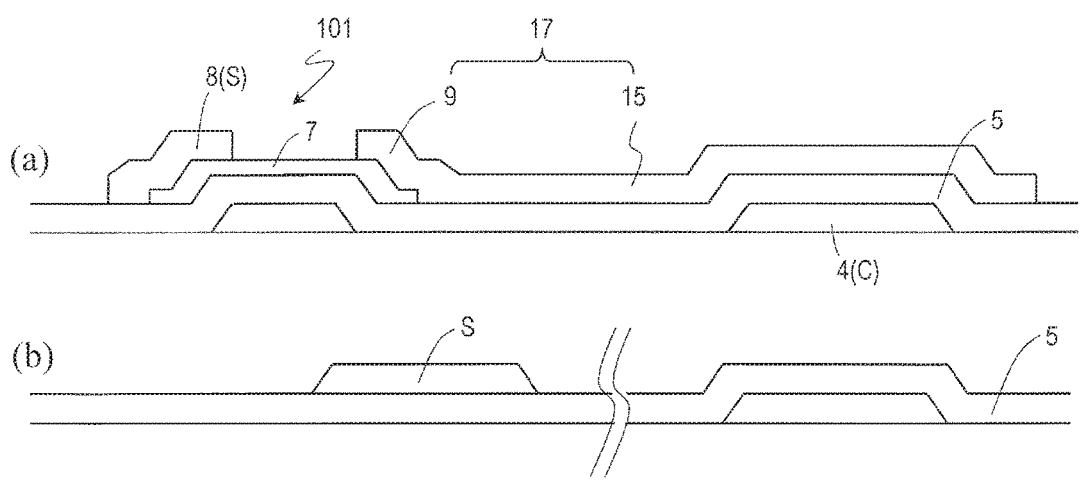
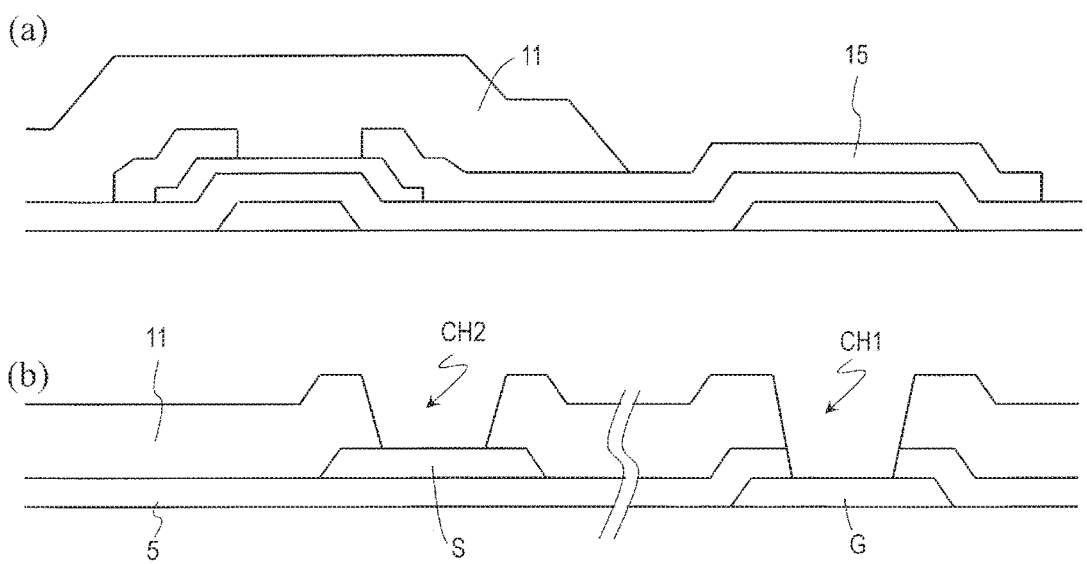

ACTIVE MATRIX SUBSTRATE AND METHOD FOR MANUFACTURING SAME, DISPLAY DEVICE USING ACTIVE MATRIX SUBSTRATE

TECHNICAL FIELD

The present invention relates to an active matrix substrate using an oxide semiconductor, and a method for manufacturing the same.

BACKGROUND ART

An active matrix substrate used in a liquid crystal display device, or the like, includes a switching element such as a thin-film transistor (Thin Film Transistor; hereinafter "TFT") for each pixel. TFTs whose active layer is an amorphous silicon film (hereinafter, "amorphous silicon TFT") and TFTs whose active layer is a polycrystalline silicon film (hereinafter "polycrystalline silicon TFT") have widely been used as such switching elements.

In recent years, it has been proposed to use an oxide semiconductor, instead of an amorphous silicon or a polycrystalline silicon, as the material of the active layer of a TFT. Such a TFT is referred to as an "oxide semiconductor TFT". An oxide semiconductor has a higher mobility than an amorphous silicon. Therefore, an oxide semiconductor TFT is capable of operating at a higher speed than an amorphous silicon TFT. Moreover, since an oxide semiconductor film is formed by a simple process as compared with a polycrystalline silicon film, it is applicable also to devices that require large areas. An active matrix substrate including an oxide semiconductor TFT (hereinafter, a "TFT substrate") is disclosed in Patent Documents 1 and 2, for example.

CITATION LIST

Patent Literature

[Patent Document No. 1] Japanese Laid-Open Patent Publication No. 2003-86808
[Patent Document No. 2] Japanese Laid-Open Patent Publication No. 2010-147458

SUMMARY OF INVENTION

Technical Problem

For example, in a conventional TFT substrate disclosed in Patent Document 1, for example, electrodes and lines provided in the display area, such as gate lines and source lines, and gate electrodes and source-drain electrodes of TFTs, are formed by using a metal film. This results in a decrease in the ratio of the light-transmitting region with respect to the pixel (hereinafter, "pixel aperture ratio").

In contrast, Patent Document 2 discloses forming the gate electrode and the source-drain electrode of the TFT by using a layered film of a transparent conductive film and a thin metal film, thereby forming a transparent TFT. However, the layered film includes a thin metal film and therefore has a poor transparency, and it is difficult to realize a TFT having a sufficiently high light transmittance.

One embodiment of the present invention, which has been made in view of the above, has an object to provide an active matrix substrate and a display device including an oxide semiconductor TFT with which it is possible to improve the pixel aperture ratio and the light transmittance.

Solution to Problem

An active matrix substrate according to an embodiment of the present invention includes: a substrate, a plurality of pixel regions arranged on the substrate in a matrix pattern in a first direction and in a second direction; a plurality of gate lines extending in the first direction; and a plurality of source lines extending in the second direction, the active matrix substrate having a display area including the plurality of pixel regions and a non-display area located in a periphery of the display area, wherein: each of the plurality of pixel regions each includes: a thin-film transistor supported on the substrate, the thin-film transistor including a gate electrode, a gate insulating layer covering the gate electrode, an oxide semiconductor layer formed on the gate insulating layer, and a source electrode and a drain electrode arranged so as to be in contact with the oxide semiconductor layer; and a pixel electrode formed integral with the drain electrode; the gate electrode is connected to one of the plurality of gate lines, and the source electrode is connected to one of the plurality of source lines; the gate electrode and the plurality of gate lines are made of a first transparent conductive film; the drain electrode and the pixel electrodes are made of a second transparent conductive film; and the active matrix substrate further includes: a plurality of gate signal lines provided in the non-display area and made of a metal film; and a first connecting portion that connects each of the plurality of gate lines to one of the plurality of gate signal lines.

In one embodiment, the active matrix substrate further includes an interlayer insulating layer covering the plurality of gate lines, wherein: the plurality of gate signal lines are formed on the interlayer insulating layer; and at the first connecting portion, the each of the plurality of gate lines is in contact with the one of the gate signal lines through an opening provided in the interlayer insulating layer.

In one embodiment, the source electrode and the plurality of source lines are made of the second transparent conductive film; and the active matrix substrate further includes: a plurality of source signal lines provided in the non-display area and made of a metal film; and a second connecting portion that connects each of the plurality of source lines to one of the plurality of source signal lines.

In one embodiment, the source electrode is made of the second transparent conductive film; and the plurality of source lines are made of a metal film.

In one embodiment, the source electrode and the plurality of source lines are made of a metal film.

In one embodiment, the each of the plurality of pixel regions includes a circuit including a further thin-film transistor; the further thin-film transistor includes: a further gate electrode made of the first transparent conductive film; the gate insulating layer extended so as to cover the further gate electrode; a further oxide semiconductor layer formed on the gate insulating layer; and a further source electrode and a further drain electrode arranged so as to be in contact with the further oxide semiconductor layer; and at least one of the further source electrode and the further drain electrode is made of the second transparent conductive film.

In one embodiment, the active matrix substrate further includes a common electrode made of the first transparent conductive film, wherein the common electrode overlaps with at least a portion of the pixel electrode with the gate insulating layer interposed therebetween.

In one embodiment, a transparent conductive layer including the drain electrode and the pixel electrode integrally made of the second transparent conductive film is separated for each of the pixel regions, the transparent conductive layer including a depressed portion in an edge thereof extending in the second direction; and the depressed portion is arranged so as to overlap with the oxide semiconductor layer.

In one embodiment, the oxide semiconductor layer includes indium and tin.

In one embodiment, the oxide semiconductor layer includes an In—Sn—Zn—O-based semiconductor.

In one embodiment, the second transparent conductive film is indium-Zinc oxide.

A display device according to one embodiment of the present invention includes: any of the active matrix substrates set forth above; a counter substrate arranged so as to oppose the active matrix substrate; and a display medium layer provided between the active matrix substrate and the counter substrate.

In one embodiment, at least one of the active matrix substrate and the counter substrate includes a black matrix; when viewed in a direction normal to the substrate, the black matrix includes a first light-blocking portion extending in the first direction and a second light-blocking portion located so as to correspond to the source lines and extending in the second direction; a width of the first light-blocking portion is smaller than a width of the gate lines; and a width of the second light-blocking portion is greater than a width of the source lines.

In one embodiment, the first light-blocking portion and the gate line do not overlap with each other when viewed in a direction normal to the substrate.

A method for manufacturing an active matrix substrate according to one embodiment of the present invention is a method for manufacturing an active matrix substrate having a plurality of pixel regions each including a thin-film transistor, the method including the steps of: (a) forming a first transparent conductive film on a substrate and patterning the first transparent conductive film so as to form a plurality of gate lines and a gate electrode of the thin-film transistor; (b) forming a gate insulating layer covering the gate lines and the gate electrodes; (c) forming an oxide semiconductor layer of the thin-film transistor on the gate insulating layer; (d) forming a second transparent conductive film on the oxide semiconductor layer and on the gate insulating layer and patterning the second transparent conductive film so as to form a source electrode and a drain electrode and a pixel electrode, the source electrode and the drain electrode being in contact with the oxide semiconductor layer, wherein the pixel electrode is formed integral with the drain electrode; (e) forming an interlayer insulating layer on the source electrode and the drain electrode, and forming a first opening in the interlayer insulating layer and the gate insulating layer through which a portion of one of the plurality of gate lines is exposed; and (f) forming a metal film on the interlayer insulating layer and in the first opening and patterning the metal film so as to form a gate signal line in contact with the one of the gate lines within the first opening.

In one embodiment, the oxide semiconductor layer includes an oxide semiconductor including indium and tin; the second transparent conductive film includes indium tin oxide or indium zinc oxide; in the step (d), the second transparent conductive film is wet-etched using, as an etchant, a mixed acid including a phosphoric acid, a nitric acid and an acetic acid.

In one embodiment, in the step (d), the second transparent conductive film is patterned so as to form a plurality of source lines integral with the source electrode; in the step (e), a second opening is formed in the interlayer insulating layer through which a portion of one of the plurality of source lines is exposed; and in the step (f), the metal film is patterned so as to form a source signal line in contact with the one of the source lines within the second opening.

In one embodiment, in the step (f), the metal film is patterned so as to form a plurality of source lines and a source signal line.

In one embodiment, the oxide semiconductor layer includes an In—Sn—Zn—C-based semiconductor.

Advantageous Effects of Invention

According to an embodiment of the present invention, it is possible to provide an active matrix substrate and a display device including an oxide semiconductor TFT with which it is possible to improve the pixel aperture ratio and the light transmittance.

BRIEF DESCRIPTION OF DRAWINGS

FIGS. 1 (*a*) and (*b*) are cross-sectional views showing a part of a display area 800 and a part of a non-display area 900 of an active matrix substrate 1001 of a first embodiment.

FIG. 4 (*a*) is a schematic cross-sectional view showing an example of a liquid crystal display device 2001 using the active matrix substrate 1001, and (*b*) is a plan view showing an example of a black matrix the liquid crystal display device 2001.

FIG. 5 Step-by-step cross-sectional views illustrating a method for manufacturing the active matrix substrate 1001, wherein (a) shows a region of the display area 800 where a TFT 101 and a common electrode 4 are formed, and (b) shows a region of the non-display area 900 where a first connecting portion 30 and a second connecting portion 40 are formed.

FIG. 6 Step-by-step cross-sectional views illustrating a method for manufacturing the active matrix substrate 1001, wherein (a) shows a region of the display area 800 where the TFT 101 and the common electrode 4 are formed, and (b) shows a region of the non-display area 900 where the first connecting portion 30 and the second connecting portion 40 are formed.

FIG. 7 Step-by-step cross-sectional views illustrating a method for manufacturing the active matrix substrate 1001, wherein (a) shows a region of the display area 800 where the TFT 101 and the common electrode 4 are formed, and (b) shows a region of the non-display area 900 where the first connecting portion 30 and the second connecting portion 40 are formed.

DESCRIPTION OF EMBODIMENTS

As described above, the transparent TFT (thin-film transistor) described in Patent Document 2 uses an electrode made of a layered film of a transparent conductive film and a thin metal film, and it is difficult to realize a TFT with a high degree of transparency. Moreover, a transparent conductive film has an electric resistance that is about two to three orders of magnitude higher than the electric resistance of a metal film, and the electric resistance of the layered film will be much higher than the electric resistance of a metal film of the same thickness. Therefore, when electrodes and lines using the layered film are used as lines such as gate signal lines and source signal lines provided in the bezel area (non-display area), it will be difficult to realize a narrow bezel. When the thickness of the metal film in the layered film is increased in order to form electrodes and lines having a lower resistance, the degree of transparency will further decrease. Thus, there is a trade-off between improving the light transmittance and lowering the resistance. Moreover, forming a layered structure of a transparent conductive film and a metal film may complicate the deposition step, thereby lowering the productivity.

In view of this, the present inventor found that it is possible to improve the light transmittance of TFTs while also lowering the resistance of lines provided in the bezel area, by employing different wiring structures in the display area where a high degree of transparency is demanded and the bezel area where low-resistance lines are demanded, thus arriving at the present invention.

In embodiments of the present invention, a transparent conductive film is used for electrodes and lines such as gate electrodes and gate lines to improve the degree of transparency within the display area, while a metal film having a lower resistance than a transparent conductive film is used to provide lines such as signal lines within the bezel area. Thus, oxide semiconductor TFTs having a high degree of transparency and a desirable productivity can be formed in the display area. It is also possible to improve the productivity by forming drain electrodes and pixel electrodes as an integral member by using a transparent conductive film. On the other hand, signal lines, driving circuits, etc., using a low-resistance metal line can be formed in the bezel area. Therefore, the degree of freedom in design increases in order to meet the demand to increase the size, increase the definition and narrow the bezel.

(First Embodiment)

An active matrix substrate according to a first embodiment of the present invention will now be described with reference to the drawings. An active matrix substrate of the present embodiment can be used in a liquid crystal display device that produces display in a VA (Vertical Alignment) mode.

Figure 2:
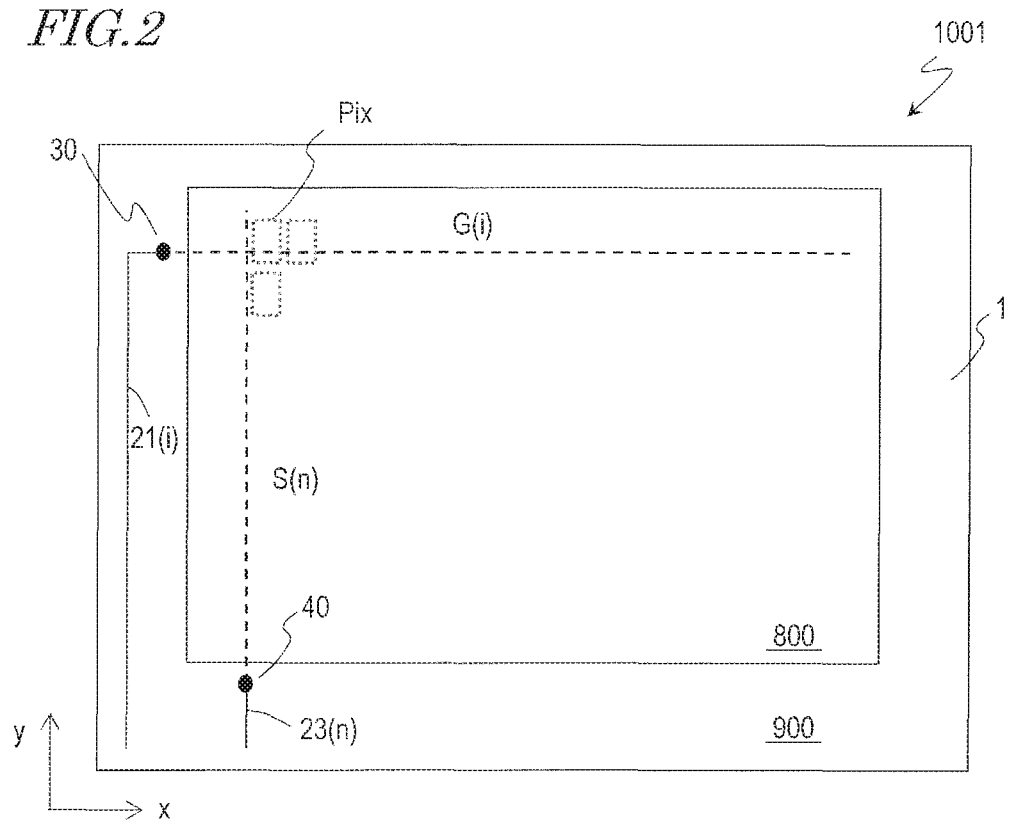
FIG. 2 A plan view schematically showing the active matrix substrate 1001 of the first embodiment.

FIGS. 1(a) and 1(b) are cross-sectional views showing a part of a display area 800 and a non-display area 900 of an active matrix substrate 1001 of the present embodiment. FIG. 2 is a plan view schematically showing the active matrix substrate 1001.

As shown in FIG. 2, the active matrix substrate 1001 includes a plurality of pixel regions Pix arranged in a matrix pattern in the first direction x and in the second direction y, a plurality of gate lines G extending in the first direction x, and a plurality of source lines S extending in the second direction y. It may further include plurality of common lines (not shown) extending in the first direction x. FIG. 2 shows only the $i^{th}$ gate line G(i) of the plurality of gate lines G and only the $n^{th}$ source line S(n) of the plurality of source lines S. The pixel regions Pix are areas corresponding to a plurality of pixels of the display device.

An area 800 of the active matrix substrate 1001 that includes the plurality of pixel regions Pix is referred to as the "display area", and an area 900 thereof that is located in a periphery of the display area 800 is referred to as the "non-display area" (or the "bezel area"). Signal lines such as gate signal lines 21, source signal lines 23 and common signal lines, terminal portions, a driving circuit, etc., may be provided in the non-display area 900. The signal lines supply signals from the driving circuit to the TFTs provided in the pixel regions Pix. FIG. 2 only shows the gate signal line 21(i) corresponding to the gate line G(i) and the source signal line 23(n) corresponding to the source line S(n).

In the present embodiment, the gate line G and the source line S are each made of a transparent conductive film. On the other hand, the gate signal line 21 and the source signal line 23 are each made of a metal film. A plurality of first connecting portions 30 for connecting the gate lines G to the corresponding gate signal lines 21 and a plurality of second connecting portions 40 for connecting the source lines S to the corresponding source signal lines 23 are provided in the non-display area 900. Although not shown in the figures, there may be further provided connecting portions for connecting common lines made of a transparent conductive film to common signal lines made of a metal film.

Note that the gate line G and the gate signal line 21 may be referred to collectively as a "gate bus line", and the source line S and the source signal line 23 may be referred to collectively as a "source bus line". That is, in the present specification, a portion (first portion) of the gate bus line that is located primarily in the display area 800 is referred to as a "gate line", and a portion (second portion) thereof that is located primarily in the non-display area 900 is referred to as a "gate signal line". A portion (first portion) of the source bus line that is located primarily in the display area 800 is referred to as a "source line", and a portion (second portion) thereof that is located primarily in the non-display area 900 is referred to as a "source signal line".

In the example shown in FIG. 2, while the first connecting portion 30 and the second connecting portion 40 are arranged in the non-display area 900, it may be arranged in the display area 800. When the first connecting portion 30 is arranged in the non-display area 900, the "gate line" also includes a portion of the gate bus line extending from the display area 800 to the first connecting portion 30. When the first connecting portion 30 is arranged in the display area 800, the "gate signal line" also includes a portion of the gate bus line extending from the non-display area 900 to the first connecting portion 30. Similarly, when the second connecting portion 40 is arranged in the non-display area 900, the "source line" includes a portion of the source bus line extending from the display area 800 to the second connecting portion 40. When the second connecting portion 40 is arranged in the display area 800, the "source signal line" also includes a portion of the source bus line extending from the non-display area 900 to the second connecting portion 40.

Each of the plurality of pixel regions Pix includes a substrate 1, and an oxide semiconductor TFT (hereinafter, referred to simply as a "TFT") 101 and a pixel electrode 15 supported on the substrate 1, as shown in FIG. 1(a).

The TFT 101 is a TFT of a bottom gate structure including a gate electrode 3 supported on the substrate 1, a gate insulating layer 5 covering the gate electrode 3, an oxide semiconductor layer 7 formed on the gate insulating layer 5, and a source electrode 8 and a drain electrode 9 arranged so as to be in contact with the oxide semiconductor layer 7. The gate electrode 3 is connected to one of a plurality of gate lines G, and the source electrode 8 is connected to one of a plurality of source lines S. The drain electrode 9 is formed integral with the pixel electrode 15. In the present specification, a layer 17 including the pixel electrode 15 and the drain electrode 9 is referred to as a "transparent conductive layer".

In the present embodiment, the gate electrode 3 and the gate line G are made of a first transparent conductive film. The source electrode 8, the source line S and the transparent conductive layer 17 (the drain electrode 9 and the pixel electrode 15) are made of a second transparent conductive film. The first and second transparent conductive films may each be indium tin oxide (ITO), indium zinc oxide (IZO), or the like, for example.

The oxide semiconductor layer 7 is arranged so that at least a channel region thereof overlaps with the gate electrode 3 with the gate insulating layer 5 interposed therebetween. In the present embodiment, a portion of the gate line G that overlaps with the oxide semiconductor layer 7 with the gate insulating layer 5 interposed therebetween is the gate electrode 3. Source and drain electrodes 8 and 9 are electrically connected respectively to the opposite sides of the channel region of the oxide semiconductor layer 7. The source and drain electrodes 8 and 9 may each be in direct contact with the oxide semiconductor layer 7. In the present embodiment, a portion that protrudes from the source line S in the first direction x to be in contact with the oxide semiconductor layer 7 is the source electrode 8.

Each pixel region Pix may further include the common electrode 4. The common electrode 4 may be formed integral with a common line C. In the present embodiment, the common electrode 4 and the common line C are formed, by using a first transparent conductive film, in the same layer as the gate electrode 3 and the gate line G.

At least a portion of the pixel electrode 15 may be arranged so as to overlap with the common line C with the gate insulating layer 5 interposed therebetween. Thus, there is formed a transparent storage capacitor including the common line C and the pixel electrode 15 as storage capacitor electrodes thereof. A storage capacitor is electrically connected in parallel to a liquid crystal capacitor in the liquid crystal display device, for example.

The TFT 101 is covered by an interlayer insulating layer (passivation film) 11. In this example, the interlayer insulating layer 11 is arranged so as to cover the TFT 11 and so as to expose the pixel electrode 15.

As shown in FIG. 1(b), provided in the non-display area 900 are a plurality of gate signal lines 21, a plurality of source signal lines 23, the first connecting portions 30 connecting the gate lines G to the corresponding gate signal lines 21, the second connecting portions 40 connecting the source lines S to the corresponding source signal lines 23, etc. Although not shown in the figure, common signal lines and common connecting portions for connecting the common lines C to the common signal lines may also be provided.

In the illustrated example, the gate signal line 21, the source signal line 23 and the common signal line are formed on the interlayer insulating layer 11 by using a common metal film. At the first connecting portion 30, the gate signal line 21 is in contact with the gate line G through the opening formed in the interlayer insulating layer 11 and the gate insulating layer 5. At the second connecting portion 40, the source signal line 23 is in contact with the source line S through the opening formed in the interlayer insulating layer 11. Although not shown in the figure, the common connecting portion may have a similar structure to that of the first connecting portion 30.

In the present embodiment, the oxide semiconductor TFT 101 having a high degree of transparency is provided in the display area 800. The source line S and the gate line G are also made of a transparent conductive film. Therefore, as compared with a conventional active matrix substrate using metal electrodes and metal lines, it is possible to improve the ratio (pixel aperture ratio) of the pixel region with respect to the total display area. As compared with a case in which electrodes and lines are made of a layered film of a transparent conductive film and a thin metal film (Patent Document 2), it is possible to improve the light transmittance and to simplify the deposition step and the patterning step, thereby improving the productivity. On the other hand, in the non-display area, the source signal line and the gate signal line are made of a low-resistance metal film. Therefore, the degree of freedom in design is high, and it is possible to provide an active matrix substrate that is suitable for realizing a narrow bezel and a high definition. For example, by decreasing the line width of the signal lines, it is possible to realize an even narrower bezel.

The oxide semiconductor of the oxide semiconductor layer 7 may include In and Sn, for example. Examples of such an oxide semiconductor include an In—Sn—Zn—O-based semiconductor, an In—Ga—Sn—O-based semiconductor, an In—Al—Sn—Zn—O-based semiconductor, etc. Then, the patterning of the second transparent conductive film for the source and drain separation can be done by wet etching, as will be described later.

Figure 3:
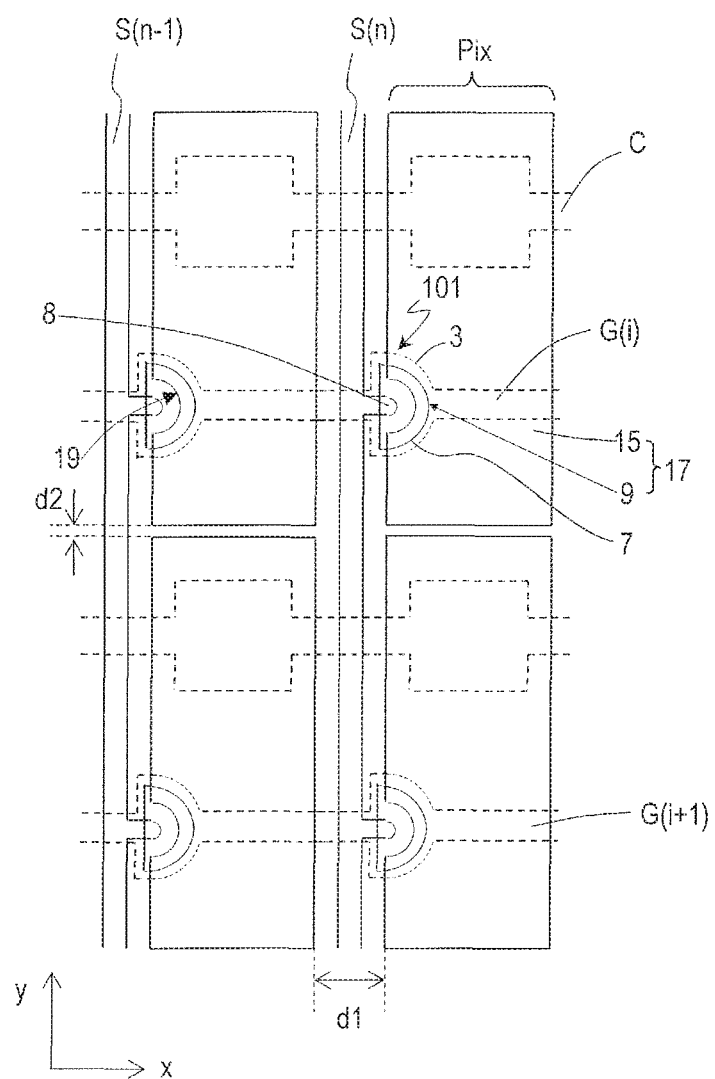
FIG. 3 A plan view showing a part of the display area 800 of the active matrix substrate 1001.

Next, referring to FIG. 3, an example of a planar structure of each pixel region Pix will be described in greater detail. FIG. 3 is a plan view illustrating a part of the display area 800.

As shown in FIG. 3, the pixel electrode 15 (herein, the transparent conductive layer 17) is divided into pixel regions Pix. The source line S extends in the second direction y within the interval d1 between transparent conductive layers 17 that are adjacent to each other in the first direction x. In the present embodiment, the source line S and the transparent conductive layer 17 are formed in the same layer by patterning the second transparent conductive film. The interval between the source line S and the transparent conductive layer 17 is set so that these members can be electrically separated from each other.

The gate line G and the common line C extend across the edge of the transparent conductive layer 17 extending in the second direction y, as seen from the direction normal to the substrate 1. The interval d2 between transparent conductive layers 17 that are adjacent to each other in the second direction y may be arranged so as not to overlap the gate line G or the common line C.

The transparent conductive layer 17 may include a depressed portion 19 along the edge thereof extending in the second direction y, as seen from the direction normal to the substrate 1. The depressed portion 19 is located above the oxide semiconductor layer 7 and overlaps with the oxide semiconductor layer 7. An area of the transparent conductive layer 17 that is in the vicinity of the side surface of the depressed portion 19 is in contact with the oxide semiconductor layer 7 and serves as the drain electrode 9. The source electrode 8 is protruding from the source line S onto the oxide semiconductor layer 7 toward the inside of the depressed portion 19. A U-shaped area of the oxide semiconductor layer 7 that is located between the source electrode 8 and the drain electrode 9 is the channel region.

With such a configuration, since the gate line G and the common line C are transparent lines, the light transmittance does not substantially change due to the width, arrangement, etc., of these lines. Thus, the degree of freedom in design is high. For example, the width and arrangement of the light-blocking portion of the black matrix can be determined irrespective of the width and arrangement of the gate line G and the common line C, as will be described later.

The active matrix substrate 1001 of the present embodiment is applicable to a display device, for example. The display device may include the active matrix substrate 1001, a counter substrate arranged so as to oppose the active matrix substrate 1001, and a display medium layer provided between the active matrix substrate 1001 and the counter substrate. The display medium layer may be a liquid crystal layer, an organic EL layer, or the like.

FIG. 4(a) is a schematic cross-sectional view showing an example of the liquid crystal display device 2001 using the active matrix substrate 1001. The liquid crystal display device 2001 includes the active matrix substrate 1001, a counter substrate 950 arranged so as to oppose the active matrix substrate 1001, a liquid crystal layer 930 arranged between the active matrix substrate 1001 and the counter substrate 950, and a backlight unit 940 for emitting light for display toward the active matrix substrate 1001. The counter substrate 950 is provided with a counter electrode 910, a color filter 920 and a black matrix (not shown). Although not shown in the figure, a polarizer is arranged on the outside of the active matrix substrate 1001 and on the outside of the counter substrate 950. The liquid crystal layer 930 and a backlight 940 are arranged in an area that corresponds to the display area 800 of the active matrix substrate 1001. Although not shown in the figure, a plurality of gate signal lines, a plurality of source signal lines, a gate driver circuit, a source driver circuit, etc., are arranged in the non-display area 900 of the active matrix substrate 1001. With the liquid crystal display device 2001, liquid crystal molecules of the liquid crystal layer 930 are aligned in each pixel in accordance with the potential difference given between the counter electrode 910 and the pixel electrode 15, thus producing display.

FIG. 4(b) is a plan view showing an example of a black matrix of the liquid crystal display device 2001. A black matrix 51 may be provided on either one of the active matrix substrate 1001 and the counter substrate 950.

The black matrix 51 includes a first light-blocking portion 53 extending in the first direction x, a second light-blocking portion 55 extending in the second direction y, and a plurality of openings. The openings are located so as to correspond to the pixel regions Pix.

The first light-blocking portion 53 is located so as to correspond to the interval d2 of the transparent conductive layer 17 with respect to the second direction y. The first light-blocking portion 53 may not overlap with the gate line G. There is no particular limitation on the width of the first light-blocking portion 53 as long as it shades the interval d2 of the transparent conductive layer 17, and the width is determined by the interval d2 and the alignment margin, for example. The width of the first light-blocking portion 53 may be smaller than the width of the gate line G.

On the other hand, the second light-blocking portion 55 is located so as to correspond to the source line S. The width of the second light-blocking portion 55 is larger than the width of the source line S. The width of the second light-blocking portion 55 may be set so that the entire interval d1 (including the source line S) of the transparent conductive layer 17 in the first direction x is shaded.

With a conventional display device in which the gate line G is formed by using a metal film, the width of the light-blocking portion is set to be larger than the width of the gate line G in order to ensure that the gate line G is shaded. In contrast, according to the present embodiment, the width of the first light-blocking portion 53 of the black matrix 51 can be made smaller than the width of the gate line G, and it is therefore possible to improve the pixel aperture ratio and the light transmittance.

The oxide semiconductor included in the oxide semiconductor layer 7 may be an amorphous oxide semiconductor layer or a crystalline oxide semiconductor having crystalline portions. Examples of the crystalline oxide semiconductor include a polycrystalline oxide semiconductor, a microcrystalline oxide semiconductor, and a crystalline oxide semiconductor of which the c axis is oriented generally vertical to the layer plane.

The oxide semiconductor layer 7 may have a layered structure including two layers or more. When the oxide semiconductor layer 7 has a layered structure, the oxide semiconductor layer 7 may include an amorphous oxide semiconductor layer and a crystalline oxide semiconductor layer. Alternatively, it may include a plurality of crystalline oxide semiconductor layers having different crystalline structures. When the oxide semiconductor layer 7 has a two-layer structure including the upper layer and the lower layer, it is preferred that the energy gap of the oxide semiconductor included in the upper layer is larger than the energy gap of the oxide semiconductor included in the lower layer. Note however that when the difference between the energy gaps of these layers is relatively small, the energy gap of the oxide semiconductor of the lower layer may be larger than the energy gap of the oxide semiconductor of the upper layer.

The material, the structure and the deposition method of the amorphous oxide semiconductor and the crystalline oxide semiconductors above, the configuration of the oxide semiconductor layer having a layered structure, etc., are described in Japanese Laid-Open Patent Publication No. 2014-007399, for example. The disclosure of Japanese Laid-Open Patent Publication No. 2014-007399 is herein incorporated by reference in its entirety.

The oxide semiconductor layer 7 may include In and Sn, for example. Examples of such an oxide semiconductor include an In—Sn—Zn—O (e.g., $In_2O_3$—$SnO_2$—$ZnO$)-based semiconductor, an In—Ga—Sn—O-based semiconductor and an In—Al—Sn—Zn—O-based semiconductor. Herein, an In—Sn—Zn—O-based semiconductor is a ternary oxide of In (indium), Sn (tin) and Zn (zinc). Although there is no particular limitation on the composition of an In—Sn—Zn—O-based semiconductor, it is preferred that the following formulae are satisfied, for example, where [In]

is the number of indium atoms, [Sn] is the number of tin atoms, and [Zn] is the number of zinc atoms.

$$0.2<[In]/([In]+[Sn]+[Zn])<0.4$$

$$0.1<[Sn]/([In]+[Sn]+[Zn])<0.4$$

$$0.2<[Zn]/([In]+[Sn]+[Zn])<0.7$$

The oxide semiconductor layer 7 may include at least one metal element of In, Ga and Zn. In the present embodiment, the oxide semiconductor layer 7 includes an In—Ga—Zn—O-based semiconductor, for example. Herein, an In—Ga—Zn—O-based semiconductor is a ternary oxide of In (indium), Ga (gallium) and Zn (zinc), and there is no particular limitation on the ratio (composition ratio) between In, Ga and Zn, which ratio may include In:Ga:Zn=2:2:1, In:Ga:Zn=1:1:1, In:Ga:Zn=1:1:2, and the like, for example. Such an oxide semiconductor layer 7 can be made of an oxide semiconductor film including an In—Ga—Zn—O-based semiconductor.

An In—Ga—Zn—O-based semiconductor may be amorphous or may be crystalline. A crystalline In—Ga—Zn—O-based semiconductor is preferably a crystalline In—Ga—Zn—O-based semiconductor of which the c axis is oriented generally vertical to the layer plane.

Note that the crystalline structure of a crystalline In—Ga—Zn—O-based semiconductor is disclosed in Japanese Laid-Open Patent Publication No. 2014-007399 (supra), Japanese Laid-Open Patent Publication No. 2012-134475, Japanese Laid-Open Patent Publication No. 2014-209727, etc. The disclosure of Japanese Laid-Open Patent Publication No. 2012-134475 and Japanese Laid-Open Patent Publication No. 2014-209727 is herein incorporated by reference in its entirety. A TFT having an In—Ga—Zn—O-based semiconductor layer has a high mobility (20 times or more that of an a-Si TFT) and a low leak current (less than one hundredth of that of an a-Si TFT), and can therefore be suitably used as a driver TFT and a pixel TFT.

The oxide semiconductor layer 7 may include an oxide semiconductor other than those mentioned above. For example, it may include an In—Al—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), an Mg—Zn—O-based semiconductor, an In—Ga—O-based semiconductor, a Zr—In—Zn—O-based semiconductor, an Hf—In—Zn—O-based semiconductor, etc.

<Method for Manufacturing Active Matrix Substrate 1001>

Next, an example of a method for manufacturing the active matrix substrate 1001 of the present embodiment will be described.

FIG. 5 to FIG. 7 are step-by-step cross-sectional views illustrating a method for manufacturing the active matrix substrate 1001. In these figures, (a) shows an area of the display area 800 where the TFT 101 and the common electrode 4 are formed. In these figures, (b) shows an area of the non-display area 900 where the first connecting portion 30 and the second connecting portion 40 are formed.

First, as shown in FIGS. 5(a) and 5(b), a first transparent conductive film is formed on the substrate 1, and is then patterned by a photolithography step known in the art. Thus, a gate line layer including the gate electrode 3, the gate line G, the common electrode 4 and the common line C is formed. Next, the gate insulating layer 5 is formed so as to cover the gate line layer.

The substrate 1 may be a transparent and insulative substrate. Herein, a glass substrate is used.

For example, an ITO (indium tin oxide) film, an IZO (indium zinc oxide) film, a ZnO film (zinc oxide film), or the like, may be used as the first transparent conductive film. Herein, an IZO film (thickness: 75 nm) is used as the transparent conductive film.

For example, a silicon oxide ($SiO_2$) layer or a silicon nitride ($SiN_x$) layer may be used as the gate insulating layer 5. Herein, a layered film including a silicon oxide ($SiO_2$) layer (thickness: 50 nm) as the upper layer and a silicon nitride ($SiN_x$) layer (thickness: 325 nm) as the lower layer is used as the gate insulating layer 5.

Next, an oxide semiconductor film is formed on the gate insulating layer 5 by a sputtering method, for example, and is then patterned to obtain the oxide semiconductor layer 7. The oxide semiconductor layer 7 is arranged so as to overlap with the gate electrode 3 with the gate insulating layer 5 interposed therebetween. Herein, for example, an In—Sn—Zn—O-based semiconductor film (thickness: 50 nm) is used as the oxide semiconductor film. The thickness of the oxide semiconductor film is 10 nm or more and 70 nm or less, for example. After the formation of the oxide semiconductor layer 7, an oxidation treatment such as an $N_2O$ plasma treatment may be performed.

Then, as shown in FIGS. 6(a) and 6(b), a second transparent conductive film is formed so as to cover the gate insulating layer 5 and the oxide semiconductor layer 7, and the second transparent conductive film is patterned to thereby form a source line layer including the source electrode 8, the source line S and the transparent conductive layer 17. The transparent conductive layer 17 includes the pixel electrode 15, and the drain electrode 9 formed integral with the pixel electrode 15. The source electrode 8 and the drain electrode 9 are arranged so as to be in contact with the oxide semiconductor layer 7. Thus, the TFT 101 is formed.

For example, an ITO (indium tin oxide) film, an IZO (indium zinc oxide) film, a ZnO film (zinc oxide film), or the like, may be used as the second transparent conductive film. Herein, an IZO film (thickness: 100 nm) is used as the transparent conductive film.

In this example, the oxide semiconductor layer 7 is an In—Sn—Zn—O-based semiconductor layer. An In—Sn—Zn—O-based semiconductor has a high mobility, but when the semiconductor is reduced and an oxygen defect occurs, the threshold voltage is likely to shift toward the negative direction. Therefore, it is preferred that the source and drain electrodes 8 and 9, which are in direct contact with the oxide semiconductor layer 7, are made of a transparent conductive film (e.g., an IZO film) containing no hydrogen.

The patterning of the second transparent conductive film may be performed by dry etching or may be performed by wet etching. The use of wet etching is advantageous in that it is possible to realize source/drain separation while reducing damage to the oxide semiconductor layer 7.

When an ITO film or an IZO film is used as the second transparent conductive film, since it is difficult to dry etch these oxide films, wet etching is used for the patterning of these oxide films. However, with a conventional active matrix substrate using an In—Ga—Zn—O-based semiconductor, the etchant used for patterning an ITO film or an IZO film may also etch an oxide semiconductor such as an In—Ga—Zn—O-based semiconductor. Therefore, it is necessary to form an etch stop layer so as to prevent the oxide semiconductor layer from being etched.

In contrast, as a result of a study, the present inventor found that the problem described above can be solved if an oxide semiconductor layer including In and Sn is used as the oxide semiconductor layer 7, and a mixed acid composed of a phosphoric acid, a nitric acid and an acetic acid (a phosphorous nitric acid) is used as the etchant, for example. A second transparent conductive film (an ITO film or an IZO film) dissolves in a phosphorous nitric acid, and an oxide semiconductor including In and Sn (an In—Sn—Zn—O-based semiconductor, an In—Ga—Sn—O-based semiconductor, etc.) does not dissolve in a phosphorous nitric acid. Therefore, by using a phosphorous nitric acid, it is possible to perform the patterning of the second transparent conductive film (source/drain separation) without having to protect the oxide semiconductor layer 7 with an etch stop layer, thus improving the productivity.

Note that the patterning of the second transparent conductive film may be performed by using dry etching. In such a case, during the dry etching, the surface of the oxide semiconductor layer 7 is also etched (overetching), thereby reducing the thickness of the oxide semiconductor layer 7, which may decrease the ON current. Therefore, taking the amount of overetch into consideration, the thickness of the oxide semiconductor layer 7 as deposited is preferably set to be large in advance.

Then, as shown in FIGS. 7(a) and 7(b), the interlayer insulating layer 11 is formed so as to cover the source line layer and the oxide semiconductor layer 7. The interlayer insulating layer 11 may include openings through which the pixel electrodes 15 are exposed in the display area 800. In the non-display area 900, a first opening CH1 through which the gate line G is exposed is formed in the interlayer insulating layer 11 and the gate insulating layer 5, and a second opening CH2 through which the source line S is exposed is formed in the interlayer insulating layer 11.

A silicon oxide (SiO$_2$) film, a silicon nitride (SiNx) film, a silicon oxide nitride (SiOxNy; x>y) film, a silicon nitride oxide (SiNxOy; x>y) film or a layered film thereof may be used as the interlayer insulating layer 11. Herein, a layered film including a silicon oxide (SiO$_2$) film (thickness: 300 nm) and a silicon nitride (SiNx) film (thickness: 150 nm) formed thereon, for example, is used as the interlayer insulating layer 11.

Then, an annealing treatment may be performed so as to terminate oxygen defects that have occurred in the oxide semiconductor layer 7 during the patterning of the second transparent conductive film. There is no particular limitation on the temperature of the annealing treatment, but it may be 250° C. or more and 450° C. or less, and preferably 300° C. or more and 400° C. or less, for example. Performing the treatment at a high temperature of 300° C. or more, it is possible to more effectively terminate a defect level and to further improve the reliability of the TFT.

Note that with a conventional active matrix substrate, a metal electrode such as Ti that exhibits a good contact property against an oxide semiconductor is typically used as the source-drain electrode. However, when an annealing treatment is performed at a high temperature (e.g., 300° C. or more) as described above, hydrogen that has been occluded in a metal is released during the annealing treatment at the interface where the metal electrode and the oxide semiconductor layer contact each other, which may extract oxygen atoms in the oxide semiconductor and increase the carrier concentration of the oxide semiconductor layer. As a result, a portion of the channel region of the oxide semiconductor layer that is in contact with the source-drain electrode may also be turned into a conductor, thereby shortening the effective channel length L. When the increase in the carrier concentration is significant, the effective channel length L may become zero, making the transistor conductive. When the temperature of the annealing treatment is set to be low in order to avoid this, it may not be possible to realize a sufficient reliability.

In contrast, according to the present embodiment, a metal oxide such as ITO or IZO is used as the source electrode 8 and the drain electrode 9. The amount of hydrogen to be released from these metal oxides during the annealing treatment is smaller than the amount of hydrogen to be released from a metal such as Ti. Therefore, even if an annealing treatment is performed at a high temperature, it is unlikely to result in a problem such as the shortening of the effective channel length L. Therefore, according to the present embodiment, by performing an annealing treatment at a high temperature of 300° C. or more, for example, it is possible to further improve the reliability of the TFT while ensuring desired TFT characteristics.

Next, as shown in FIG. 1(b), a metal film is formed on the interlayer insulating layer 11 and in the first and second openings, and the metal film is patterned, thereby forming the gate signal line 21 and the source signal line 23. The gate signal line 21 is connected to the gate line G in the first opening. The source signal line 23 is connected to the source line S in the second opening. Thus, the first connecting portion 30 and the second connecting portion 40 are obtained.

While there is no particular limitation on the metal film, the metal film may be a film containing a metal such as aluminum (Al), tungsten (W), molybdenum (Mo), tantalum (Ta), chromium (Cr), titanium (Ti) or copper (Cu), an alloy thereof or a metal nitride thereof, for example.

(Second Embodiment)

An active matrix substrate according to a second embodiment of the present invention will now be described with reference to the drawings. The active matrix substrate of the present embodiment is different from the active matrix substrate 1001 shown in FIG. 1 to FIG. 3 in that the source line is made of a metal film.

Figure 8:
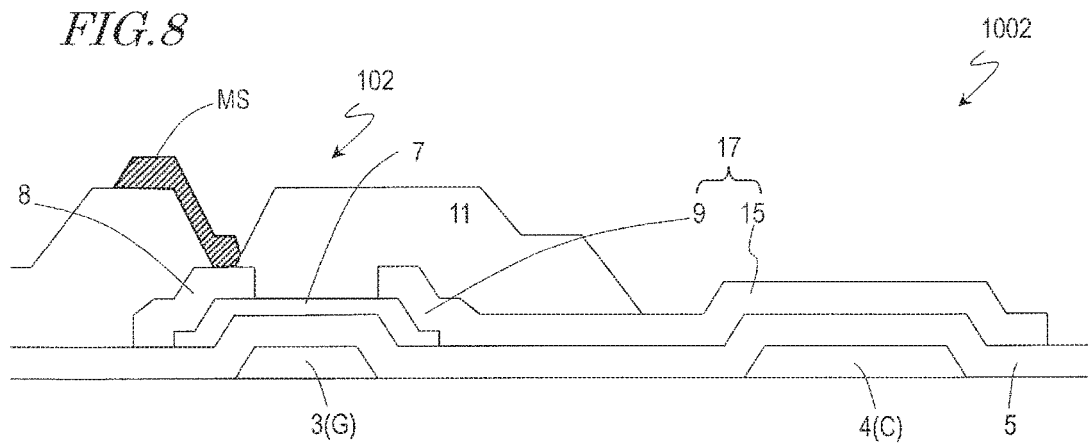
FIG. 8 A cross-sectional view illustrating an active matrix substrate 1002 of a second embodiment.
Figure 9:
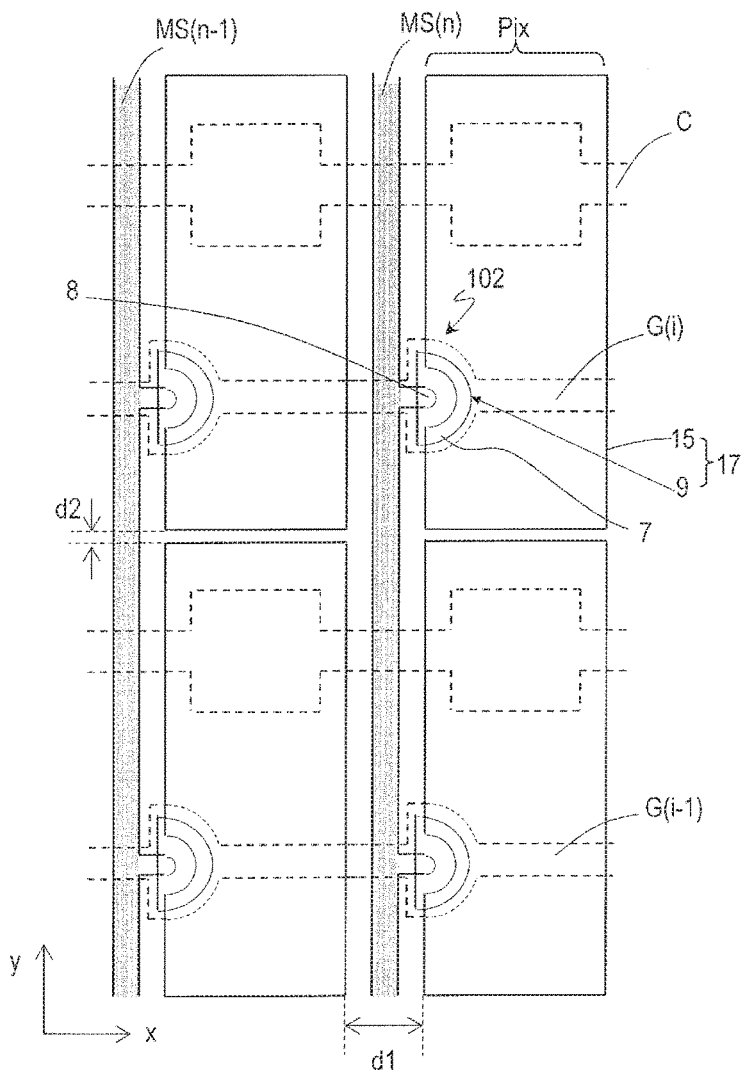
FIG. 9 A plan view showing a part of the display area 800 of the active matrix substrate 1002.

FIG. 8 is a cross-sectional view illustrating an active matrix substrate 1002 of the present embodiment. FIG. 9 is a plan view showing a part of the display area 800 of the active matrix substrate 1002.

With the active matrix substrate 1002, the source electrode 8 of a TFT 102 is made of the second transparent conductive film, but a source line MS is made of a metal film. The source line MS is electrically connected to the corresponding source electrode 8. In this example, the source line MS is formed on the interlayer insulating layer 11, and is connected to the source electrode 8 in the opening provided in the interlayer insulating layer 11. The source line MS may be made of the same metal film as the gate signal line and the source signal line provided in the non-display area. In such a case, the source line MS may be formed integral with the source signal line.

Although not shown in the figure, a connecting portion between the gate line G and the gate signal line and a connecting portion between the common line C and the common signal line are provided, as in the embodiment described above, in the non-display area. The connecting portion connecting between the source line MS and the source signal line does not need to be formed. Otherwise, the configuration is similar to that shown in FIG. 1 to FIG. 3.

The active matrix substrate 1002 of the present embodiment is applicable to a liquid crystal display device. The liquid crystal display device may have the configuration as described above with reference to FIG. 4(a).

Figure 10:
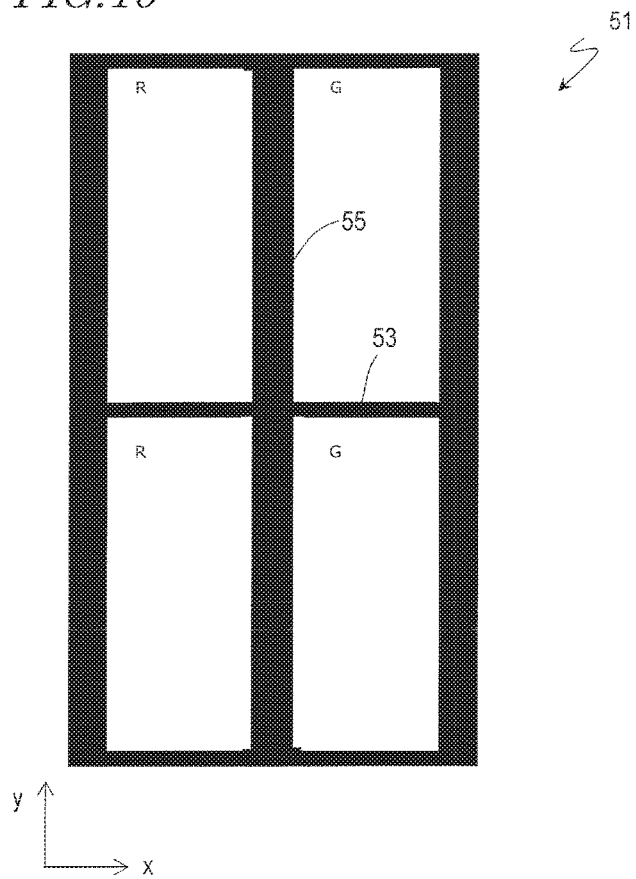
FIG. 10 A plan view showing an example of a black matrix used in a liquid crystal display device using the active matrix substrate 1002.

FIG. 10 is a plan view illustrating a black matrix to be used in the liquid crystal display device of the present embodiment. The black matrix 51 may have a similar configuration to that described above with reference to FIG. 4(*b*). Also in the present embodiment, the width of the first light-blocking portion 53 can be made smaller, irrespective of the width of the gate line G, and it is possible to improve the pixel aperture ratio. In the present embodiment, since the source line MS and the transparent conductive layer (the pixel electrode 15) are not formed in the same layer, the interval d1 of the transparent conductive layer 17 along the first direction x can be made smaller than that of the active matrix substrate 1001. Moreover, since the source line MS is made of a low-resistance metal film, the width of the source line MS can be made smaller than that when it is made of a transparent conductive film. Therefore, the width of the second light-blocking portion 55 can be made smaller than the width of the second light-blocking portion 55 in the black matrix shown in FIG. 4(*b*).

The active matrix substrate 1002 can be manufactured by a method similar to that described above with reference to FIG. 5 to FIG. 7, for example. Note however that the source line MS is made of a metal film, rather than from the second transparent conductive film. Openings through which the source electrode 8 are exposed are provided in the interlayer insulating layer 11, and the source lines MS and the source electrodes 8 are connected together in the openings. With the manufacturing method of the present embodiment, the source electrode 8, the drain electrode 9 and the pixel electrode 15 can be formed by using the same transparent conductive film, and it is therefore possible to improve the productivity. The source electrode 8 and the drain electrode 9 to be in contact with the oxide semiconductor layer 7 are made of ITO or IZO as in the embodiment described above, and the annealing treatment can be performed at a higher temperature than when a metal electrode is used, thereby obtaining reliable TFTs 102.

(Third Embodiment)

An active matrix substrate according to a third embodiment of the present invention will now be described with reference to the drawings. The active matrix substrate of the present embodiment is different from the active matrix substrate 1001 shown in FIG. 1 to FIG. 3 in that the source line and the source electrode are formed by using a metal film.

Figure 11:
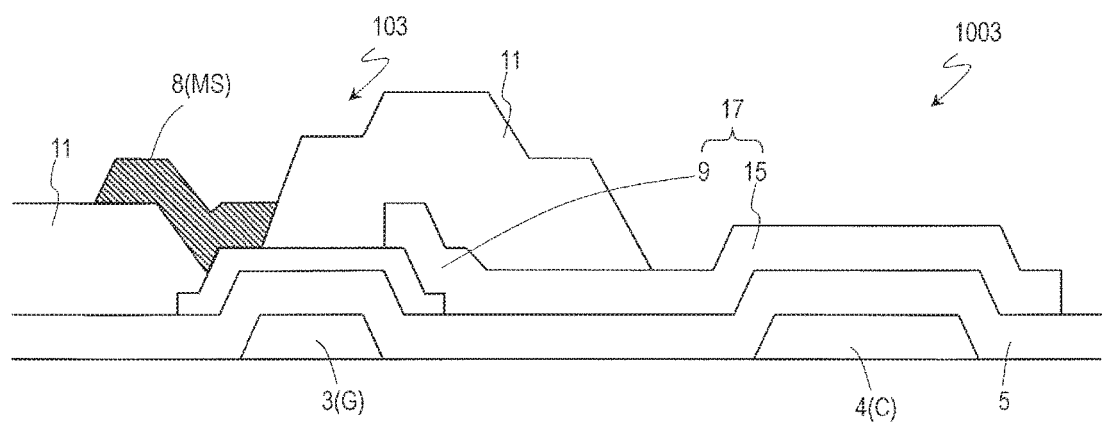
FIG. 11 A cross-sectional view illustrating an active matrix substrate 1003 of a third embodiment.
Figure 12:
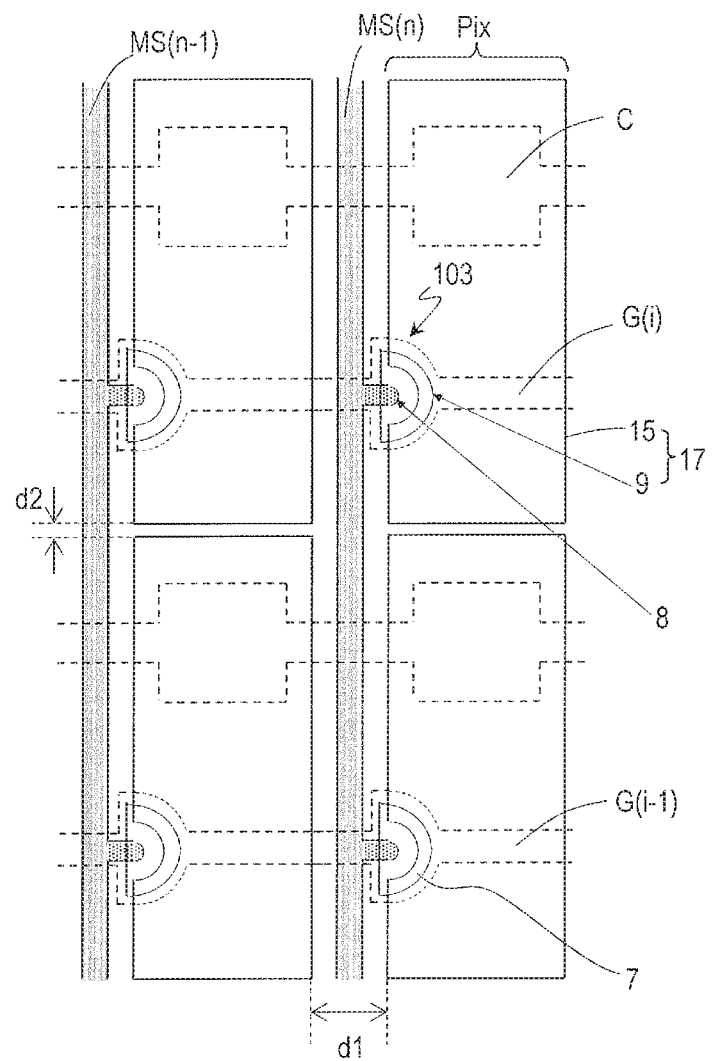
FIG. 12 A plan view showing a part of the display area 800 of the active matrix substrate 1003.

FIG. 11 is a cross-sectional view illustrating an active matrix substrate 1003 of the present embodiment. FIG. 12 is a plan view showing a part of the display area 800 of the active matrix substrate 1003.

With the active matrix substrate 1003, the source electrode 8 and the source line MS of a TFT 103 are made of a metal film. In this example, the source electrode 8 and the source line MS are formed on the interlayer insulating layer 11, and are in contact with the oxide semiconductor layer 7 in the opening provided in the interlayer insulating layer 11. The source electrode 8 and the source line MS may be made of the same metal film as the gate signal line 21 and the source signal line 23. In such a case, the source line MS may be formed integral with the source signal line (not shown). Although not shown in the figure, a connecting portion between the gate line G and the gate signal line and a connecting portion between the common line C and the common signal line are provided, as in the embodiment described above, in the non-display area. The connecting portion connecting between the source line MS and the source signal line does not need to be formed. Otherwise, the configuration is similar to that shown in FIG. 1 to FIG. 3.

Also in the present embodiment, as in the embodiments described above, the active matrix substrate 1003 may be applied to a display device such as a liquid crystal display device. The configuration of the black matrix 51 used in a display device is similar to the configuration described above with reference to FIG. 10. Also in the present embodiment, the width of the first light-blocking portion 53 can be made smaller, irrespective of the width of the gate line G, and it is possible to improve the pixel aperture ratio. The source electrode 8 and the source line MS are not formed in the same layer with the transparent conductive layer 17 (the pixel electrode 15). Moreover, since the source line MS is made of a low-resistance metal film, the width of the source line MS can be made small. Therefore, the width of the second light-blocking portion 55 can be made smaller than the width of the second light-blocking portion 55 in the black matrix shown in FIG. 4(*b*).

Figure 13:
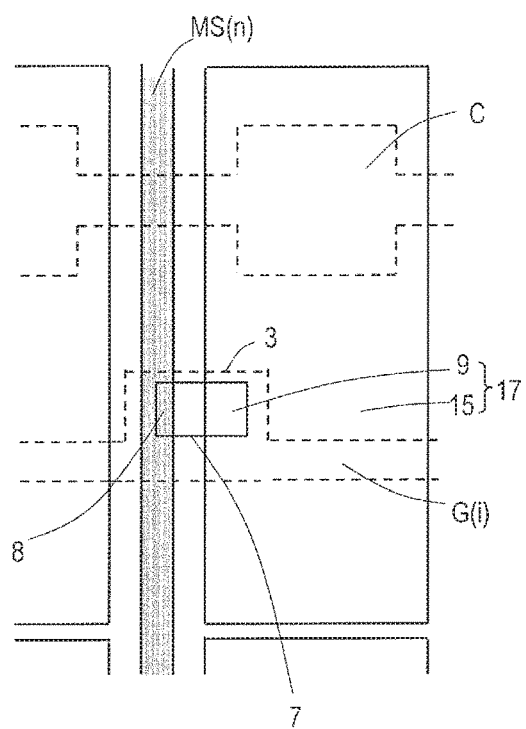
FIG. 13 A plan view illustrating another active matrix substrate of the third embodiment.

Note that as shown in FIG. 13, the source electrode 8 may be a part of the source line MS extending in the second direction y. With such a configuration, the interval d1 of the transparent conductive layer 17 in the first direction x can be made even smaller, and it is possible to further improve the pixel aperture ratio.

The active matrix substrate 1003 can be manufactured by a method similar to that described above with reference to FIG. 5 to FIG. 7, for example. Note however that the source electrode 8 and the source line MS are made of a metal film, rather than from the second transparent conductive film. Moreover, openings through which the oxide semiconductor layers 7 are partly exposed are provided in the interlayer insulating layer 11, and the source electrode 8 and the oxide semiconductor layer 7 are connected together in the openings.

(Fourth Embodiment)

An active matrix substrate according to a fourth embodiment of the present invention will now be described with reference to the drawings.

Figure 14:
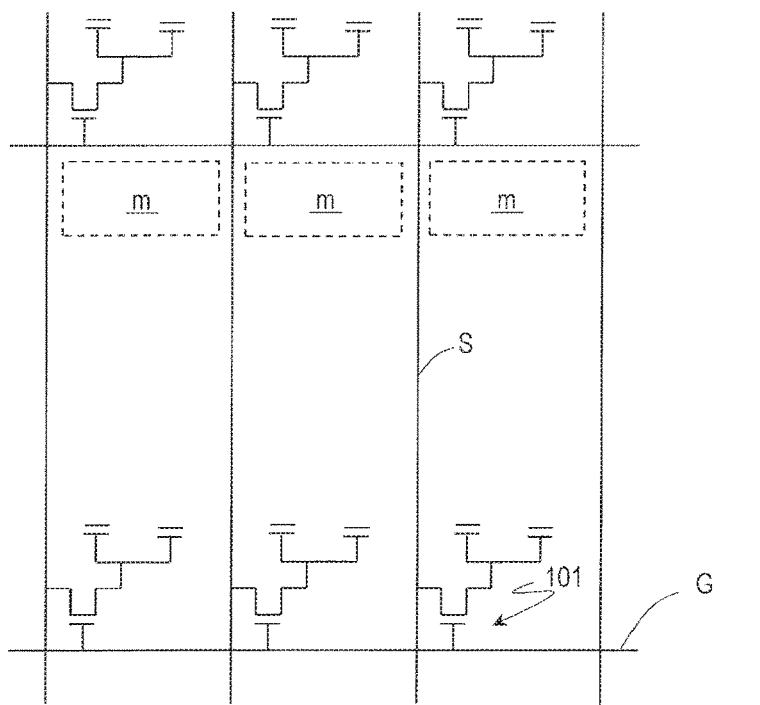
FIG. 14 A diagram illustrating an active matrix substrate 1004 of a fourth embodiment.

FIG. 14 is a diagram illustrating a part of an active matrix substrate 1004 of the present embodiment. The active matrix substrate 1004 includes a functional circuit m including other oxide semiconductor TFTs (referred to as "circuit TFTs") within each pixel. Otherwise, the structure may be similar to that of any of the active matrix substrates 1001 to 1003 described above.

The functional circuit m may be any of various sensor circuits, a gate driver circuit, a source driver circuit, or the like. At least one of the circuit TFTs of the functional circuit m may include a source electrode or a drain electrode made of the second transparent conductive film. At least one of the circuit TFTs may be a TFT having a similar configuration to those of the TFTs 101, 102 and 103 described above, for example. Lines included in the functional circuit m may be transparent lines made of the first or second transparent conductive film. Then, there is no need to shade the functional circuit m with a black matrix, and it is possible to improve the pixel aperture ratio and the light transmittance.

Figure 15:
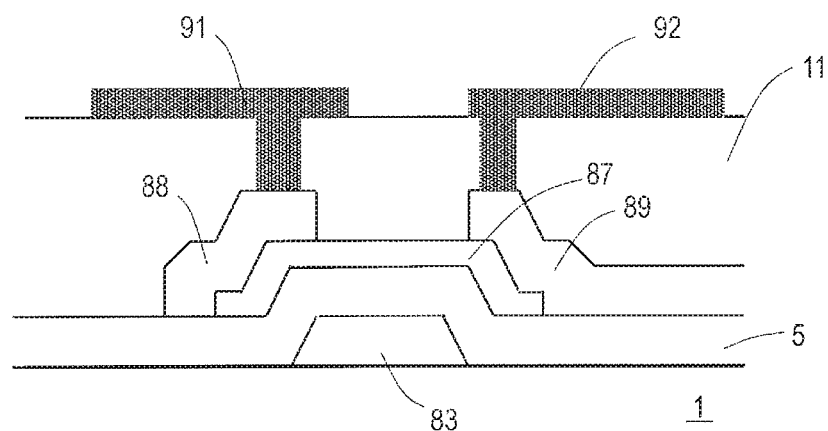
FIG. 15 A cross-sectional view showing an example of a circuit TFT used in a functional circuit m of the active matrix substrate 1004.

When a driver circuit is formed as the functional circuit m, for example, lines of the functional circuit m may be formed by using the same metal film as the signal lines in the non-display area. In such a case, as shown in FIG. 15, a circuit TFT includes a gate electrode 83 made of the first transparent conductive film, an oxide semiconductor layer 87, and source and drain electrodes 88 and 89 made of the second transparent conductive film, wherein the source and drain electrodes 88 and 89 may be connected to metal lines 91 and 92, respectively. Note that when a metal line is used, it is preferred that a black matrix is arranged so as to shade the functional circuit m.

(Other Embodiments)

The active matrix substrate of the embodiment described above is applicable not only to a liquid crystal display device of a vertical alignment mode (VA mode), but also to a liquid crystal display device of a transverse electric field mode such as an in-plane switching (IPS) mode or a fringe field switching (FFS) mode, for example, where the pixel electrode and the counter electrode are provided on the TFT substrate, for example. The structure of a TFT of an IPS-mode or FFS-mode liquid crystal display device is well known in the art, and will not be described below.

Note that since two transparent electrode layers are provided in a liquid crystal display device of an FFS mode, the storage capacitor can be formed by using the two transparent electrode layers. In contrast, a liquid crystal display device of a VA mode is normally provided with only one transparent electrode layer (pixel electrode). Therefore, when the embodiments described above are applied to a liquid crystal display device of a VA mode, it is possible to form a transparent storage capacitor without separately adding a transparent electrode layer, thereby realizing a particularly significant advantageous effect.

Moreover, while liquid crystal display devices have been illustrated above, the active matrix substrate of the embodiments described above can also be used in other display devices such as organic electroluminescence (EL) display devices, inorganic electroluminescence display devices, MEMS display devices, etc. Particularly, when the embodiments are applied to an organic EL display device, it is possible to realize a transparent display capable of displaying an image on both sides of an organic EL display device.

Figure 16:
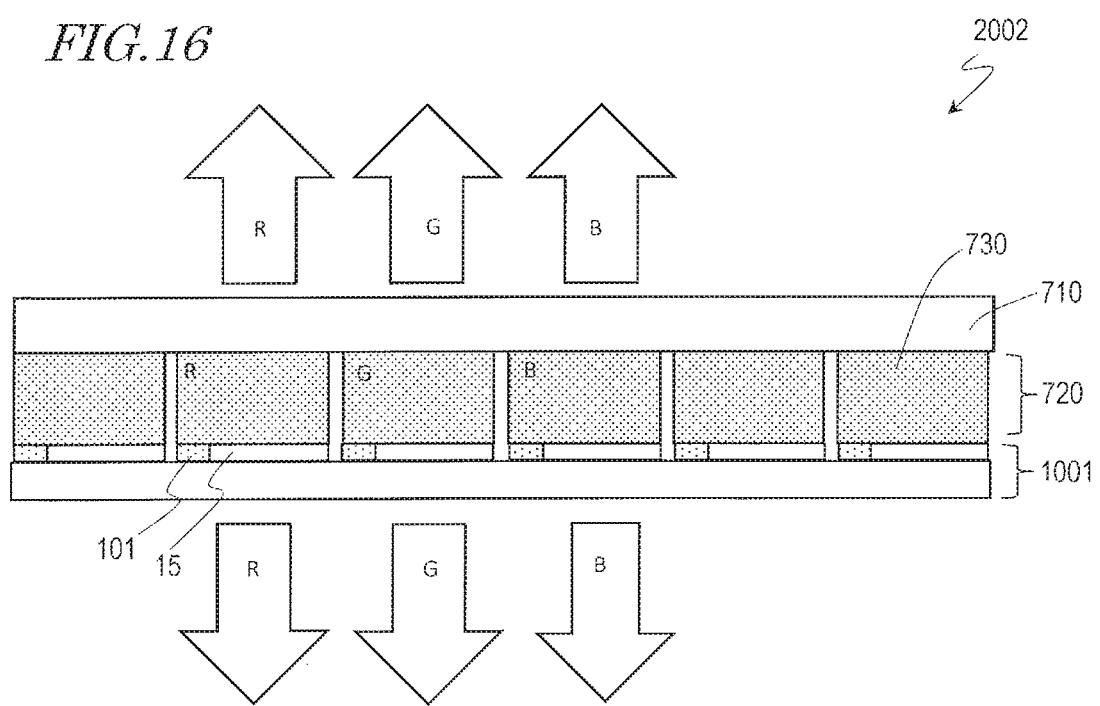
FIG. 16 A diagram schematically showing an organic EL display device 2002 to which the active matrix substrate 1001 is applied.

FIG. 16 is a diagram schematically showing an organic EL display device 2002 to which the active matrix substrate of the embodiments described above is applied.

The organic EL display device 2002 includes the active matrix substrate 1001, a transparent counter substrate 710 arranged so as to oppose the active matrix substrate 1001, and a display medium layer 720 arranged between the active matrix substrate 1001 and the counter substrate 710. A transparent electrode is formed on the display medium layer 720 side of the counter substrate 710. The display medium layer 720 includes red, green or blue organic EL light-emitting layers 730 arranged so as to correspond to the pixel electrodes. Light emitted from the organic EL light-emitting layer 730 is output both toward the active matrix substrate 1001 side and toward the counter substrate 710 side, thereby displaying an image on both sides. The active matrix substrates 1002 and 1003 shown in FIG. 8 or FIG. 11 may be used as the active matrix substrate.

Conventional organic EL display devices have a problem in that the pixel aperture ratio on the active matrix substrate side decreases due to TFTs and metal lines formed on the active matrix substrate. In contrast, with the organic EL display device 2002, the active matrix substrate 1001 includes transparent TFTs 101 and transparent gate lines, and it is possible to suppress the decrease in the pixel aperture ratio on the active matrix substrate 1001 side. Therefore, it is possible to efficiently use light on both sides of the organic EL display device 2002.

The TFTs 101, 102 and 103 of the embodiments described above may have an etch stop structure with an etch stop covering the channel region. An oxygen-containing insulating layer such as an $SiO_2$ layer, for example, can be used as an etch stop layer. With a TFT having an etch stop structure, the channel-side edge of the source-drain electrode is located on the etch stop layer, for example. An etch stop-type TFT is formed by forming an etch stop layer that covers a portion of the upper surface of a semiconductor layer to be the channel region, thereafter forming a conductive film to be source-drain electrodes on the semiconductor layer and the etch stop layer, and performing the source/drain separation.

The TFT of the embodiments described above may have a top contact structure in which the source-drain electrode is in contact with the upper surface of the semiconductor layer or a bottom contact structure in which the source-drain electrode is in contact with the lower surface of the semiconductor layer. With the bottom contact structure, the source-drain electrode may be formed by using a conductive film that is resistant to the etchant used for the patterning of the semiconductor layer so that the source-drain electrode, which is formed prior to the semiconductor layer, is not etched in the step of patterning the semiconductor layer. When an oxalic acid is used as the etchant, the source-drain electrode may be formed by using a polycrystalline metal oxide conductive film that is resistant to an oxalic acid (e.g., a poly-ITO, or the like).

INDUSTRIAL APPLICABILITY

The embodiments of the present invention are widely applicable to display devices such as liquid crystal display devices, organic electroluminescence (EL) display devices and inorganic electroluminescence display devices, imaging device such as image sensor devices, and electronic device such as image input devices and fingerprint reading device, etc.

REFERENCE SIGNS LIST

1 Substrate
3 Gate electrode
4 Common electrode
5 Gate insulating layer
7 Oxide semiconductor layer (active layer)
8 Source electrode
9 Drain electrode
11 Interlayer insulating layer
15 Pixel electrode
17 Transparent conductive layer
21 Gate signal line
23 Source signal line
101, 102, 103 Oxide semiconductor TFT
S Source line
G Gate line
C Common line
1001, 1002, 1003, 1004 Active matrix substrate
2001 Liquid crystal display device
2002 Organic EL display device

The invention claimed is:

1. An active matrix substrate comprising: a substrate, a plurality of pixel regions arranged on the substrate in a matrix pattern in a first direction and in a second direction; a plurality of gate lines extending in the first direction; and a plurality of source lines extending in the second direction, the active matrix substrate having a display area including the plurality of pixel regions and a non-display area located in a periphery of the display area, wherein:
each of the plurality of pixel regions includes:
a thin-film transistor supported on the substrate, the thin-film transistor including a gate electrode, a gate insulating layer covering the gate electrode, an oxide semiconductor layer formed on the gate insulating layer, and a source electrode and a drain electrode arranged so as to be in contact with the oxide semiconductor layer; and a pixel electrode formed integral with the drain electrode;

the gate electrode is connected to one of the plurality of gate lines, and the source electrode is connected to one of the plurality of source lines;

the gate electrode and the plurality of gate lines are made of a first transparent conductive film;

the drain electrode and the pixel electrode are made of a second transparent conductive film; and the active matrix substrate further includes:

a plurality of gate signal lines provided in the non-display area and made of a metal film; and a first connecting portion that connects each of the plurality of gate lines to one of the plurality of gate signal lines.

2. The active matrix substrate according to claim 1, further comprising an interlayer insulating layer covering the plurality of gate lines, wherein:

the plurality of gate signal lines are formed on the interlayer insulating layer; and at the first connecting portion, the each of the plurality of gate lines is in contact with the one of the gate signal lines through an opening provided in the interlayer insulating layer.

3. The active matrix substrate according to claim 1, wherein:

the source electrode and the plurarity of source lines are made of the second transparent conductive film; and the active matrix substrate further comprises:

a plurality of source signal lines provided in the non-display area and made of a metal film; and a second connecting portion that connects each of the plurality of source lines to one of the plurality of source signal lines.

4. The active matrix substrate according to claim 1, wherein:

the source electrode is made of the second transparent conductive film; and the plurality of source lines are made of a metal film.

5. The active matrix substrate according to claim 1, wherein the source electrode and the plurality of source lines are made of a metal film.

6. The active matrix substrate according to claim 1, wherein:

the each of the plurality of pixel regions includes a circuit including a further thin film transistor;

the further thin-film transistor includes:

a further gate electrode made of the first transparent conductive film;

the gate insulating layer extended so as to cover the further gate electrode;

a further oxide semiconductor layer formed on the gate insulating layer; and a further source electrode and a further drain electrode arranged so as to be in contact with the further oxide semiconductor layer; and at least one of the further source electrode and the further drain electrode is made of the second transparent conductive film.

7. The active matrix substrate according to claim 1, further comprising a common electrode made of the first transparent conductive film, wherein the common electrode overlaps with at least a portion of the pixel electrode with the gate insulating layer interposed therebetween.

8. The active matrix substrate according to claim 1, wherein:

a transparent conductive layer including the drain electrode and the pixel electrode integrally made of the second transparent conductive film is separated for each of the pixel regions, the transparent conductive layer including a depressed portion in an edge thereof extending in the second direction; and the depressed portion is arranged so as to overlap with the oxide semiconductor layer.

9. The active matrix substrate according to claim 1, wherein the oxide semiconductor layer includes indium and tin.

10. The active matrix substrate according to claim 9, wherein the oxide semiconductor layer includes an In—Sn—Zn—O-based semiconductor.

11. The active matrix substrate according to claim 1, wherein the second transparent conductive film is indium-Zinc oxide.

12. A display device comprising:

the active matrix substrate according to claim 1;

a counter substrate arranged so as to oppose the active matrix substrate; and a display medium layer provided between the active matrix substrate and the counter substrate.

13. The display device according to claim 12, wherein:

at least one of the active matrix substrate and the counter substrate includes a black matrix;

when viewed in a direction normal to the substrate, the black matrix includes a first light-blocking portion extending in the first direction and a second light-blocking portion located so as to correspond to the source lines and extending in the second direction;

a width of the first light-blocking portion is smaller than a width of the gate lines; and a width of the second light-blocking portion is greater than a width of the source lines.

14. The display device according to claim 13, wherein: the first light-blocking portion and the gate line do not overlap with each other when viewed in a direction normal to the substrate.

* * * * *